United States Patent [19]

Grubb

[11] Patent Number: 4,756,991
[45] Date of Patent: Jul. 12, 1988

[54] FLUORESCENT TONERS SURFACE COATED WITH POLYMERIC QUATERNARY AMMONIUM COMPOUND AND SLIP AGENT

[75] Inventor: Eugene L. Grubb, Colts Neck, N.J.

[73] Assignee: E. I. Du Pont de Nemours and Company, Wilmington, Del.

[21] Appl. No.: 24,869

[22] Filed: Mar. 11, 1987

Related U.S. Application Data

[63] Continuation of Ser. No. 785,184, Oct. 7, 1985, abandoned.

[51] Int. Cl.$^4$ .............................................. G03C 5/24
[52] U.S. Cl. ................................. 430/449; 430/110; 430/291; 430/331; 430/528; 430/965
[58] Field of Search ............... 430/110, 291, 331, 528, 430/965, 449

[56] References Cited

U.S. PATENT DOCUMENTS

| | | |
|---|---|---|
| 4,118,231 | 10/1978 | Mayama et al. ..................... 430/528 |
| 4,224,396 | 9/1980 | Pollet . | |
| 4,306,996 | 12/1981 | Windhager . | |
| 4,343,894 | 8/1982 | Minamizono et al. .............. 430/528 |
| 4,374,924 | 2/1983 | Yokoyama et al. ................. 430/528 |
| 4,397,941 | 8/1983 | Fickes . | |
| 4,407,916 | 10/1983 | Akagi et al. ..................... 430/291 X |
| 4,546,072 | 10/1985 | Matrick ........................... 430/291 X |

OTHER PUBLICATIONS

Voedisch, R. W., Luminescent Pigments, Organic, in *Pigment Handbook*, vol. 1, P. C. Patton, ed., 1973 (pp. 891–901).

*Primary Examiner*—Roland E. Martin

[57] ABSTRACT

Fluorescent dry nonelectroscopic toner comprising fluorescent pigmented organic resin particles having a size distribution of 0.2 to 50 micrometers, surface coated with at least 0.1% by weight of silicone oil or fluorocarbon compound, in combination with at least 0.5% by weight of a water soluble, polymeric quaternary ammonium compound as defined. The fluorescent toner is useful in color developing positive- and negative-working photosensitive elements. The toners provide good toning quality and excellent lack of background color, together with stability on aging.

12 Claims, No Drawings

FLUORESCENT TONERS SURFACE COATED WITH POLYMERIC QUATERNARY AMMONIUM COMPOUND AND SLIP AGENT

This application is a continuation of application Ser. No. 785,184, filed Oct. 7, 1985, now abandoned.

TECHNICAL FIELD

This invention relates to dry nonelectroscopic toners. More particularly this invention relates to dry nonelectroscopic fluorescent toners comprising fluorescent pigmented organic resin particles surface coated with a liquid slip agent and a water soluble, polymeric quaternary ammonium compound.

BACKGROUND ART

Reproduction processes are known wherein positive-working photopolymerizable elements and negative-working photosensitive elements are exposed imagewise through an original to form nontacky and tacky image areas. Positive-working photopolymerizable elements are described in Chu and Cohen, U.S. Pat. No. 3,649,268, and negative-working photosensitive elements are described in Cohen and Fan, U.S. Pat. Nos. 4,174,216 and 4,191,572. The image is developed by toning with a suitable toner which desirably adheres only in the tacky image areas. Excess toner which may be present is removed from the nontacky areas to provide, for example, an image which is a proof of the original or which can be used to transfer the image to another surface. Multilayer proofs such as surprint or overlay proofs can be made as well.

In view of the increasing importance of proof-making in the printing industry and the problems inherent therein, improved toners and applicators for applying these toners are desirable. Some recognized improvements in nonelectroscopic toners are those described in Chu and Manger, U.S. Pat. No. 3,620,726; mixtures using these toners described in Gray U.S. Pat. No. 3,909,282; and the toners of Manger, Fickes and Long described in U.S. Pat. No. 4,215,193. From the early use of pads dipped in toners, improved toner applicators are the subject of Sandner U.S. Pat. No. 4,019,821 (hand operated toning) and Tobias U.S. Pat. No. 4,069,791 (automatic toning).

Toning the tacky image areas of photosensitive elements by application of any of the above described toners has the problem that the background color resulting from the toners is difficult to completely remove from the nontacky areas of the elements. Generally an attempt is made to mechanically remove excess toner from the nontacky areas of the elements. Generally an attempt is made to mechanically remove excess toner from the nontacky areas using a cloth, brush or other toner removal means. It is known that static electricity is generated by rubbing dissimilar materials together. The amount of static formed varies, depending on the nature of the material being toned and the toner removal means. For example, cleaning brushes which are close to the element in the triboelectric table would be expected to generate a relatively low charge. It would be expected, therefore, that an acrylic brush would generate only a small charge with respect to an element that contains an acrylic compound in its photosensitive layer. The toner, however, can also generate a charge when rubbed against the brush or other cleaning means and the photosensitive element. If the toner, the cleaning means, and the element had an identical place in the triboelectric table, substantially no static charge would be generated. Such a system, while desirable, is not generally achieved. Nevertheless, removal of background color in the nontacky areas is desirable. Manual cleaning is time consuming, and machine cleaning adds to overall equipment costs. Even after clean-up, some undesirable stain is usually present in the nontacky areas.

The term "background color" as used herein is the color present in the nontacky background areas of an exposed and toned positive-working or negative-working photosensitive element before any step is taken to remove such toner. Background color is the sum of two components: "stain", which as used herein is the color which is normally not capable of being removed from the nontacky background areas despite repeated wiping, and "clean-up", which as used herein is the color which normally can be removed from the nontacky background areas, e.g., by wiping, air impingement, etc.

Dry nonelectroscopic toners comprising pigmented organic resin particles have been developed which provide relatively good clean-up and are substantially non-staining in the nontacky areas of the photosensitive elements used to prepare multilayer proofs. For example, the dry nonelectroscopic toner particles described in Fickes, U.S. Pat. No. 4,397,941, have been surface treated with at least 0.5% by weight of a slip agent, e.g., silicone oil having a weight average molecular weight of about 230 to 50,000; saturated hydrocarbons having a weight average molecular weight of about 200 to 10,000; or fluorocarbon compounds having a weight average molecular weight of about 500 to 500,000, in combination with at least 1% by weight of a defined antistatic agent. Unfortunately, fluorescent pigments are particularly sensitive to various surface coatings, and although the problem of "background color" may be substantially reduced by coating fluorescent pigments as described in the prior art, a rapid and severe deterioration of toning quality makes such treated toners impractical for ordinary use. For example, fluorescent toners coated with a combination of nonionic antistatic agent and silicone oil exhibit reasonable clean-up and stain characteristics when freshly made, but quickly form hard aggregates that render the toners unusable. It is believed that solubility of the coating compounds in the pigmented resin particles may be the cause of these severe aging problems.

Fluorescent pigments have the unusual property of absorbing light at particular frequencies and reemitting this energy at lower frequencies, i.e., longer wavelengths. Many minerals and certain natural products, as well as many synthetic organic compounds and inorganic pigments fluoresce in response to UV radiation. Particularly useful for most toning purposes are pigments that fluoresce in response to both UV radiation and visible light. In daylight fluorescent pigments, the emitted light combines additively with the normal reflected light so that these pigments appear to glow in normal daylight. These intensely vivid colors now find commercial use in a variety of applications, including safety markers, fabrics, signs, plastics and printing inks.

Fluroescent pigments are also used to provide special effects in the photosensitive reproduction processes described above. In this application, however, fluroescent pigments have presented severe problems with respect to background color, i.e., clean-up and stain. These problems are particularly difficult to solve because fluroescent toners surface coated as described in the prior art quickly become unusable due to the formation of hard aggregates.

It is desired to provide dry, nonelectroscopic fluroescent toner particles which when surface coated exhibit improved clean-up qualities and nonstaining of the non-tacky areas of photsensitive elements, as well as having excellent toning properties, both initially and after storage. It is particularly desired to avoid the formation of hard aggregates that render such treated toners unusable.

DISCLOSURE OF THE INVENTION

In accordance with this invention there is provided a dry nonelectroscopic fluroescent toner comprising flueorescent pigmented organic resin particles having a size distribution within the range of 0.2 to 50 micrometers, the improvement whereby the pigmented particles are surface coated with at least 0.1% by weight of a liquid slip agent selected from the class consisting of silicone oil having a weight average molecular weight of about 230 to 50,000 and a fluorocarbon compound insoluble in the fluroescent pigmented resin having a weight average molecular weight of 500 to 500,000, in combination with at least 0.5% by weight of a water soluble, polymeric quaternary ammonium compound selected from the class consisting of (a)

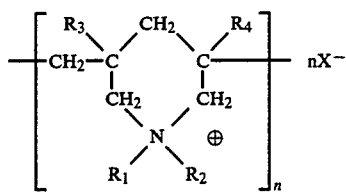

wherein $R_1$ and $R_2$ are independently selected from alkyl groups of 1 to 4 carbon atoms, $R_3$ and $R_4$ are independently selected from H or $CH_3$, n is a number from 100 to 50,000, and X is a water-solubilizing anion;

(b)

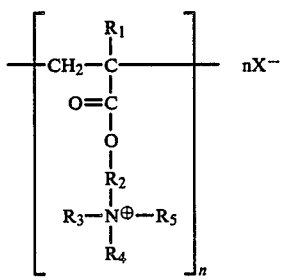

where $R_1$ is H or $CH_3$; $R_2$ is $C_xH_{2x}$ where $x=2-18$; $R_3$ and $R_4$ are $C_xH_{2x+1}$ where $x=1-4$; $R_5$ is the same as $R_3$ or $\phi\text{-}CH_2$; X is a water-solubilizing anion; and n is 50 to 20,000;

(c)

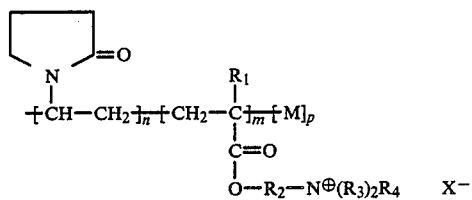

where n is 40 to 90 mole percent, m is 5 to 40 mole percent, p is 0 to 50 mole percent, and $n+m+p=100$; $R_1$ is H or $CH_3$; $R_2$ is $C_xH_{2x}$ where $x=1$ to 18; $R_3$ is $CH_3$ or $CH_2CH_3$; $R_4$ is $CH_3$, $CH_2CH_3$ or $\phi\text{-}CH_2$; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

(d)

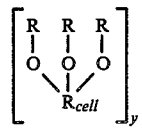

where $R_{cell}$ is a residue of an anhydroglucose unit from cellulose ($C_6H_{10}O_5$), methyl cellulose, ethyl cellulose, hydroxyethylcellulose, or hydroxypropyl methyl cellulose; y is the degree of polymerization of 50–20,000 or more; and R may be the same or different and is:

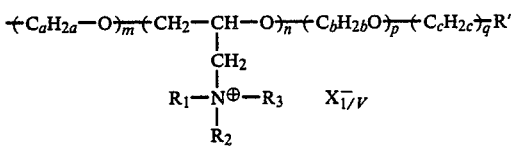

where a is an interger from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n; and m may be equal to or different from p; R' is a member of a group consisting of H, COOH, COONa, COOK, COONH$_4$ with the proviso that when q is zero, R' is H; $R_1$, $R_2$ and $R_3$ taken individually represent a member selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, N-methylpeperidine, N-ethylpiperdine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4; and (e) copolymer of hydroxyehtyl cellulose and diallyldimethyl ammonium chloride.

The improved dry toners of this invention are nonelectroscopic. Nonelectroscopic means that the toners are neither repelled from nor attracted to a charged rod when placed in close proximity to the particles. The lower propensity of the toners of the invention to stain nontacky areas and the ease with which the toners can be removed from such areas as well as their stability upon aging are largely attributed to the surface of the toner particles being coated with the combination of the slip agent and the polymeric quaternary ammonium compounds, both of which are more fully described below.

The fluorescent pigmented resin particles of the invention are organic resin particles dyed or otherwise pigmented wtih fluorescent pigments, e.g., Radient Fluroescent Pigment, R-104-G Cerise 716, a product of Radient Colors, Richmond, Calif.; Hi-Viz Vivid Blue, B-3556 and Hi-Viz Strong Magenta, G3055, manufactured by Lawter Chemicals, Inc., Northbrook, Ill. The Lowter Hi-Viz blue, B-3556, and Hi-Viz Strong Magenta, G3055, are pigmented triazine-sulfonamide resin particles. Although certain organic compounds exhibit fluorescence in their pure form, e.g., the aldazines of certain aromatic aldehydes such as 2-hydroxy-1-naphthaldehyde, most fluorescent pigments must be in diluted form in order to fluoresce. Higher than optimal concentrations result in quenching of the fluorescence due to such processes as molecular collisions and reabsorption of emitted light. Certain resin matrices are particularly preferred for achieving the required dilution of pigment, e.g., triazine-modified sulfonamide resins. Glyceryl phthalate or vinyl resins may also be used.

Particle size distributions can be measured, for example, by a Coulter counter, Coulter Electronics, Inc., Hialeah, Fla. The term "particle size" as used herein with respect to the fluorescent pigmented resin particles and the finished toners covers the size distribution of the smallest, independently acting unit which is called upon to discriminate between the exposed and unexposed areas of the imaging element.

Slip agents which are useful for coating the particulate toner surface are selected from the group consisting of silicone oil having a weight average molecular weight of about 230 to 50,000; and fluorocarbon compounds insoluble in the fluorescent pigmented resin having a weight average molecular weight of 500 to 500,000. The slip agent when a liquid at normal room temperature is a nonsolvent for the pigmented resin particles, is nonvolatile, and is stable to aerial oxidation.

Silicone oil is the preferred slip agent. Silicone oils useful in the invention include: polydimethylsiloxane and polymethyl (R) siloxane where R is an alkyl chain with 2 to 12 carbon atoms, e.g., ethyl to dodecyl.

Water soluble, polymeric quaternary ammonium compounds which are useful for coating the particulate toner surface in cooperation with the above described slip agents are selected from the class consisting of (a)

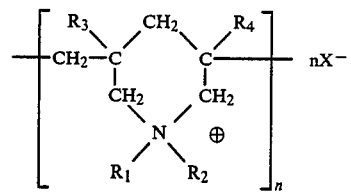

wherein $R_1$ and $R_2$ are independently selected from alkyl groups of 1 to 4 carbon atoms, $R_3$ and $R_4$ are independently selected from H or $CH_3$, n is a number from 100 to 50,000, and X is a water-solubilizing anion; e.g. chlorine, fluorine, etc.

(b)

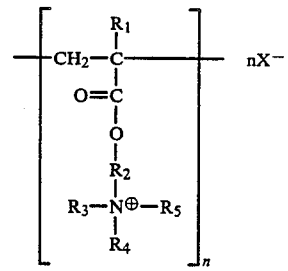

where $R_1$ is H or $CH_3$; $R_2$ is $C_xH_{2x}$ where x is 2 to 18, preferably 2 to 8; $R_3$ and $R_4$ are $C_xH_{2x+1}$ where x is 1 to 4; $R_5$ is the same as $R_3$ or $\phi$-$CH_2$; X is a water-solubilizing anion, e.g., Cl, Br, I, $SO_4$, $HSO_4$, $C_xH_{2x+1}OSO_3$ where x is 1 to 4; and n is 50 to 20,000;

(c)

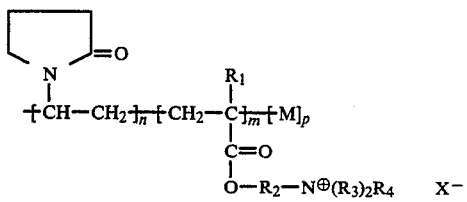

where n is 40 to 90 mole percent, m is 5 to 40 mole percent, p is 0 to 50 mole percent, and n+m+p equal 100; $R_1$ is H or $CH_3$; $R_2$ is $C_xH_{2x}$ where x is 1 to 18; $R_3$ is $CH_3$ or $CH_2CH_3$; $R_4$ is $CH_3$, $CH_2CH_3$, or $\phi$-$CH_2$; X is a water-solubilizing anion, e.g., I, Cl, Br, $SO_4$, $HSO_4$, $CH_3OSO_3$, resulting from the heteropolymerization employing an optional monovinyl nonhydroxy-containing monomer different from and copolymerizable with the m or n units and a weight average molecular weight of 10,000 to 1,000,000;

(d)

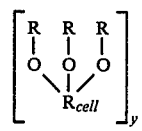

where $R_{cell}$ is a residue of an anhydroglucose unit from cellulose ($C_6H_{10}O_5$), methyl cellulose, ethyl cellulose, hydroxyethylcellulose or hydroxypropyl methyl cellulose; y is the degree of polymerization of 50–20,000 or more; and R may be the same or different and is:

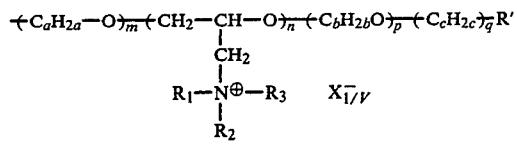

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is a member of a group consisting of H, COOH, COONa, COOK, COONH$_4$ with the proviso that when q is zero, R' is H; R$_1$, R$_2$ and R$_3$ taken individually represent a member selected from a group consisting of alkyl, aryl, aralykyl, alkaryl, cycloalkyl, alkoxyalkyl, and alkoxyaryl radicals where each of R$_1$, R$_2$ and R$_3$ can contain up to 10 carbon atoms with the proviso that when said member is an alkosyalkyl radical there are at least two carbon atoms separating the oxygen atom from the nitrogen atom, and with the further proviso that the total number of C atoms in radicals represented by R$_1$, R$_2$ and R$_3$ is from 3 to 12 with the further proviso that when R$_1$, R$_2$ and R$_3$ are taken together the nitrogen atom to which R$_1$, R$_2$ and R$_3$ are attached can be a component of a heterocyclic ring selected from a group consisting of pyridine, alpha-methyl pyridine, 2,5-dimethyl pyridine; 2,4,6-trimethyl pyridine, N-methyl-piperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4; and (e) copolymer of hydroxyethyl cellulose and diallyl-dimethyl ammonium chloride.

Water soluble, polymeric quaternary ammonium compounds of the types described above are disclosed in the following United States patents.

(a) Hoover and Carothers U.S. Pat. No. 3,490,938;

(b) Restaino U.S. Pat. No. 3,926,756 and Phalangas U.S. Pat. No. 3,948,740;

(c) Barabas and Fein U.S. Pat. No. 3,910,862; and (d) Stone and Rutherford U.S. Pat. No. 3,472,840.

The most preferred water soluble, polymeric quaternary ammonium compound is an aqueous solution of poly(dimethyl diallyl ammonium chloride) which falls in class (a) above. Preferred water soluble polymeric quaternary amonium compounds added from aqueous solutions for classes (b), (c) and (d) defined above are:

class (b), N,N,N-trimethyl-2-[2-methyl-1-oxo-2-propenyl)oxy]-methyl sulfate;

class (c) copolymer of vinyl pyrolidone and dimethyl aminoethylmethacrylate quaternized with dimethyl suflate;

class (d) polymeric quaternary ammonium salt of hydroxyethyl cellulose reacted with a trimethyl ammonium substituted epoxide.

The polymeric quaternary ammonium compound is coated on the surface of the fluorescent pigmented resin particles in amounts of at least 0.5% by weight up to about 15% by weight. A preferred range for the polymeric quaternary ammonium compound is 2 to 10% by weight. The slip agent is coated on the pigmented resin particles in an amount of at least 0.1% by weight up to about 20% by weight. A preferred range of the slip agent is 0.3 to 10% be weight. The above preferred ranges are praticularly effective when the toners are applied to tacky image areas of photosensitive elements using a modified automatic toning apparatus similar to that described in Tobias, U.S. Pat. No. 4,069,791, which is incorporated herein by reference. If the amount of polymeric quaternary ammonium compound and slip agent exceed the maximum amounts good clean-up is achieved in nontacky image areas but pick-off of the toner in the tones image areas may occur. Pick-off is defined as low adhesion of a toner to tacky areas such that when a photoimageable element is applied over the toned image it does not adhere well to the previously toned image area (so that when the cover sheet of the element is removed areas of the layer above the toned area come off with the cover sheet, taking with it some of the applied toner).

The toner particles can be made as illustrated in the examples. The polymeric quaternary ammonium compound and slip agent can be coated in either order or simultaneously on the surface of the fluorescent pigmented resin particles. It has been found, however, that the particular blender or mixing equipment used may have a bearing on the order in which the coatings occur on the pigmented resin particles. For example, when a Patterson Kelley Twin Shell Blender manufactured by Patterson Kelley Co., Division of Harsco Corp., East Stroudsburg, PA or a Hobart H-600 Mixer manufactured by the Hobart Corp., Troy, Ohio is used it is advantageous to add the polymeric quaternary ammonium compound followed by the slip agent. When the mixing (coating) is accomplished in a Red Devil #30, 5400 Paint Conditioner Model MKI-R, Red Devil, Inc., Union, N.J. or other equivalent type of mixer, the slip agent and polymeric quaternary ammonium compound can be added in either order or simultaneously, although it is preferred to add the polymeric quaternary ammonium compound first, as described in Example I. Other comparable milling devices can be used. The blending or mixing is carried out for at least five minutes up to 30 minutes or longer after each addition. After blending or mixing, the particles are permitted to dry or can be dried at elevated temperature, e.g., 50 to 150° C. Some pigments are heat sensitive and require lower drying temperatures. For example, Lawter Hi-Viz Blue, B-3556, should preferably be dried at temperatures between 25 and 60 certain samples were dried at 110° C. without problem. A final milling step to achieve toner particle sizes in the range of 0.5 to 25 micrometers may be required for good toning quality. An alpine Pin Mill is preferred; however, various hammer mills may be used, e.g., Laboratory Pulverizing Mill.

The fluorescent toners are useful for color development of a surface having imagewise tacky and nontacky areas. The nonelectroscopic toners described above are applied to the image-bearing surface, and the toner particles are distributed over the image surface so that they become embedded solely in the tacky image areas. The remaining toner particles are physically removed, e.g., by wiping with a suitable cloth or the clean-up section of a toning apparatus if one is used. The nontacky areas are left substantially free of the toner particles. The required imagewise tacky/nontacky surface may be present in (a) a positive-working photophlymerizable layer as described in Chu et al., U.S. Pat. No. 3,649,268; wherein the exposed areas become photohardened, (b) a negative-working photosensitive layer as described in Abele and Grossa, U.S. Pat. No. 4,243,741, wherein the exposed areas become tacky, comprising at least one thermoplastic binder and a photosensitive system, consisting essentially of I. at least one dihydropyridine compound of the formula

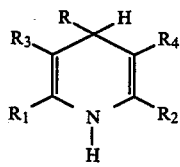

wherein R is alkyl, alkenyl of 3 to 11 carbon atoms, phenylalkyl, phenylalkenyl, unsubstituted aryl of 6 to 10 carbon atoms, and heteroaryl, $R_1$ and $R_2$, which can be the same or different, are alkyl, and $R_3$ and $R_4$, which can be the same or different, are COOR', COR', CN, R' is alkyl; and II. at least one hexaarylbiimidazole compound; or (c) a negative-working imagewise exposed element containing nontonable image areas and tacky nonphotosensitive image areas, as described in Cohen and Fan, U.S. Pat. No. 4,174,216. These patents are incorporated by reference. Other systems known to those skilled in the art can be used provided that after imagewise exposure both tacky and nontacky image areas are present. The tacky and nontacky image areas in these systems can be formed directly upon exposure to actinic radiation, or further treatment with solutions, heat or other means may be necessary to obtain tacky image areas.

The above toned elements can be used to form surprint multicolor proofs by sequentially laminating at least two toned photoimaged layers in registry on a support. Each tonable layer is exposed through a different color separation transparency, and colored or developed with toners in a spectral region corresponding to the color separation transparency used for exposure. In most cases when natural color rendition is desired four photoimaged toned elements are present in a surprint proof, the toned elements and separation transparencies corresponding respectively to yellow, magenta, cyan and black.

A particularly preferred use of the claimed toners involves automatic color development of a surface having imagewise tacky and nontacky areas by dispensing and embedding dry particulate fluorescent toners on the surface by means of an automatic toning apparatus having a dispenser for dispensing the toner above the surface, an applicator for embedding the particulate toners in the surface, and means for moving the tacky surface past the dispenser and the applicator. The dispenser includes a hopper having an independently movable side wall, and means to oscillate the side wall laterally of the transport path of the tacky surface, thereby supplying the particulate material to the surface at a uniform, controlled rate. Particularly preferred is the improvement wherein the new dry, nonelectroscopic fluorescent toners described above are automatically dispensed, embedded, and the excess removed.

The toned elements particularly useful in conjunction with the automatic toning apparatus comprise:

1. A supported photopolymer layer having tacky and nontacky areas, solely the tacky image areas being toned with the toners of the invention, and 2. A photopolymer element comprising in order from top to bottom, a layer comprising a nontacky photohardenable material with ethylenically unsaturated or benzophenone type groups, a contiguous layer of a nonphotosensitive tacky organic material toned imagewise with the toners of the invention, and a support. A preferred mode of the invention is described in Example 1.

INDUSTRIAL APPLICABILITY

The dry nonelectroscopic fluorescent toners are useful for application to positive- or negative-working tacky photosensitive or nonphotosensitive surfaces in multilayer photosensitive elements which are used to prepare color proofs, e.g., overlays and surprints. The toners are particularly useful in the toning of photosensitive elements in conjunction with a toning apparatus, e.g., the automatic toning apparatus as described in Tobias, U.S. Pat. No. 4,069,791. The toners are easily prepared and exhibit good toning quality, and the proofs obtained are substantially stain free in the nontacky areas. Good clean up of excess toner is readily achieved. Particularly advantageous for industrial utility is the fact that the fluorescent toners of the invention have good stability on aging and do not form hard aggregates on storage.

EXAMPLES

This invention is illustrated by the following examples wherein the percentages are by weight. The molecular weights given for the polymers in the photopolymer elements are weight average molecular weights which can be determined by a light scattering technique using known standard samples, e.g., polystyrene, polymethacrylic acid, polymethylmethacrylate, etc., as known to those skilled in the art. Liquid Additives used in the examples are identified in Table 1 below.

TABLE 1

LIQUID ADDITIVE

1. A 20% aqueous solution of poly(dimethyl diallyl ammonium chloride).
2. SILWET ® L 722, a nonionic siloxaneoxyalkylene block copolymer ("SILWET" is a registered trademark of Union Carbide, Danbury, CT.).
3. R(OCH$_2$CH$_2$)$_n$-OH wherein R is an alkyl chain with 13 carbon atoms and n is 5.
4. Silicone oil which is dimethyl polysiloxane (200 fluid CS, Dow Corning Co., Midland Glass, MI) having a viscosity of 100 cps.

EXAMPLE 1

200 grams of Lawter Hi-Viz Vivid Blue, B-3556 pigment manufactured by Lawter Chemicals, Inc., the amount indicated below of a first Liquid Additive described above in Table 1, and a 9 inch (22.86 cm) stainless steel chain were placed in a two quart Bain Marie container (Le Beau Products, Baraboo, Wis. 53913). After stirring with a spatula, the mixture was blended for 30 minutes on a Red Devel #30 Paint Conditioner followed by the addition of the amount indicated below of silicone oil (Liquid Additive 4). The mixture was then blended for another 30 minutes and dried overnight at 110°C. After drying the mixture was ground in a Laboratory Pulverizing Mill manufactured by Weber Brothers and White Metal Works, Inc., Chicago, Ill. to give a nice smooth toner.

These toners were tested fresh and after being stored in a two quart Bain Marie container for 1 month under ambient conditions. The toners were used to tone positive and negative photosensitive elements as described below.

A positive-working photopolymerizable element similar to that described in Example 1, Chu and Cohen U.S. Pat. No. 3,649,268, was prepared having a 0.0003 inch (0.00076 cm) photopolymer layer coated on 0.0005 inch (0.0013 cm) polyethylene terephthalate film support, and covered by a suitable 0.00075 inch (0.0019 cm) polypropylene cover sheet. As described in Example 1 of said U.S. Pat. No. 3,649,268, the cover sheet was removed and the photopolymer whereby the exposed areas became hardened and the unexposed areas remained tacky. The polyethylene terephthalate film support was then removed and the image was developed by toning using a toning apparatus similar to that shown in FIG. 2 of tobias U.S. Pat. No. 4,069,791, which has a hopper with a laterally oscillating sidewall and two oscillating pads. The machine was run at 4 ft/min (1.22 m/min). To obtain equilibrium conditions rapidly the toning pad was first saturated with toner by applying toner on the pad across its width and pressing it with a 1 inch (2.54 cm) wide spatula.

A negative-working photosensitive element was prepared by laminating in surface-to-surface relationship at room temperature with a pressure of about 40 psi (2.81 kg/dm$^2$) a supported photopolymerizable layer (I) and supported tonable, tacky nonphotosensitive elastomeric contiguous layer (II). Layers I and II are prepared as follows:

I. Nontonable Photopolymerizable Layer

A coating solution of a photopolymerizable composition was prepared by mixing together the following ingredients:

| Ingredient | Weight (g) |
| --- | --- |
| Polymethyl methacrylate (MW 200,000–300,000) | 41.54 |
| Di-(3-acryloxy-2-hydroxypropyl) ether of Bisphenol-A | 51.86 |
| (2-chlorophenyl-4,5-diphenyl imidazolyl) dimer | 2.20 |
| 2-(Stilbyl-4″)-naphtho-1′,2′:4,5)1,2,3-triazol-2″-sulfonic acid phenyl ester | 2.20 |

| Ingredient | Weight (g) |
| --- | --- |
| 2-Mercaptobenzoxazole | 1.50 |
| Polyethylene oxide (MW 600,000) | 0.70 |
| Methanol | 20.70 |
| Methylene chloride | 323.70 |

This solution was coated at a coating weight of about 40 mg/dm$^2$ when dried on a clear polyethylene terephthalate film having a thickness of 0.0005 inch (0.0015 cm) which was surface treated by electrostatic discharge at 0.07 coulombs/ft$^2$ (0.74 coulombs/m$^2$).

II. Tonable, Tacky Elastomeric Contiguous Layer

A coating solution was prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55–60) | 79.75 |
| Tetra-bis[methylene-3-(3′,5′-di-t-butyl-4′-hydroxyphenyl)propionate] methane | 0.50 |
| Methylene chloride to make | 1333.30 |

This solution was coated on polyethylene terephthalate film having a releasable layer of polydimethyl siloxane coated thereon to give a coating weight of about 125 mg/dm$^3$ when dried.

The negative-working element was exposed through the electrostatic discharge treated, clear polyethylene terephthalate film for about 30 seconds on a Montakop II exposure device from Exposure Systems Corp., Bridgeport, Conn., fitted with a photopolymer lamp (5 kW) and a Kokomo glass filter (No. 400) Kokomo Opalescent Glass Co., Kokomo, IN. The distance between the lamp and the vacuum frame of the device was about 38 inches (96.52 cm). After exposure, the exposed element was taped securely to a suitable flat surface, and the clear polyethylene terephthalate cover sheet was stripped by pulling at one corner with an even, continuous motion at an angle of about 135°–180°. The resulting exposed, photopolymerized image adhered to the treated polyethylene terephthalate film and was removed therewith exposing equivalent areas of the contiguous layer (II). The tacky image was developed by toning using the toning apparatus described above. Results shown in Table 2 below were obtained.

TABLE 2

| TONER SAMPLE | FIRST LIQUID | SECOND LIQUID | FRESH BC[1] | TONER TQ[2] | AGED BC[1] | TONER TQ[2] |
| --- | --- | --- | --- | --- | --- | --- |
| (% ACTIVE INGREDIENT) | | | | | | |
| | | | POSITIVE-WORKING FILM | | | |
| A | 1(7) | 4(5) | CLEAN | SLIGHTLY* STREAKY | CLEAN | SLIGHTLY* STREAKY |
| B | 1(5.3) | 4(4) | CLEAN | SMOOTH | CLEAN | SMOOTH |
| C | 1(4) | 4(3) | CLEAN | SMOOTH | CLEAN | SMOOTH |
| | | | NEGATIVE-WORKING FILM | | | |
| A | 1(7) | 4(5) | CLEAN | SMOOTH | SMOOTH | SMOOTH |
| B | 1(5.3) | 4(4) | CLEAN | SMOOTH | CLEAN | SMOOTH |

TABLE 2-continued

| TONER SAMPLE | FIRST LIQUID (% ACTIVE INGREDIENT) | SECOND LIQUID | FRESH BC[1] | TONER TQ[2] | AGED BC[1] | TONER TQ[2] |
|---|---|---|---|---|---|---|
| C | 1(4) | 4(3) | CLEAN | SMOOTH | CLEAN | SMOOTH |

*This problem is eliminated when final milling is carried out on an Alpine Pin Mill as described in Example 2.
[1]Background Color
[2]Toning Quality

EXAMPLE 2

200 grams of Lawter Hi-Viz Vivid Blue, B-3556 pigment manufactured by Lawter Chemicals, Inc., the amount indicated below of a first Liquid Additive from Table 1, and a 9 inch (22.86 cm) stainless steel chain were placed in a two quart Bain Marie container described in Example 1 and stirred with a spatula. The amount indicated below of a second Liquid Additive from Table 1 was then added to the container. After stirring with a spatula, the mixture was blended for 60 minutes on the Red Devil #30 Paint conditioner described in Example 1. Toner Sample A was then dried overnight at 55° C. Samples B, C, D, E, F, and G did not require drying because the first and second Liquid Additives were added as neat liquids. Samples A, F and G were then ground in an Alpine Pin mill, type 160Z, manufactured by the Alpine Corporation, Augsburg, W. Germany, These toners were used to tone a positive-working element such as that described in Example 1, fresh and after aging 1 month under ambient conditions.

Results are shown in Table 3.

TABLE 3

| TONER SAMPLE | FIRST LIQUID (% ACTIVE) INGREDIENT | SECOND LIQUID (% ACTIVE) INGREDIENT | FRESH TONER BACKGROUND COLOR | FRESH TONER TONING QUALITY | AGED TONER BACKGROUND COLOR | AGED TONER TONING QUALITY |
|---|---|---|---|---|---|---|
| A | 1(4) | 4(2.5) | CLEAN | SMOOTH | CLEAN | SMOOTH |
| B | 2(10) | — | CLEAN | STREAKY | CLEAN | VERY STREAKY |
| C | 3(5.3) | 4(5.3) | DIRTY | STREAKY | DIRTY | VERY STREAKY |
| D | 3(10) | 4(1) | CLEAN | STREAKY | CLEAN | VERY STREAKY |
| E | 4(1) | — | VERY DIRTY | SMOOTH | VERY DIRTY | SMOOTH |
| F | 2(10) | — | CLEAN | STREAKY | | |
| G | 3(5.3) | 4(5.3) | CLEAN | SLIGHTLY STREAKY | CLEAN | STREAKY* |

*Aged 4 days at ambient conditions.

EXAMPLE 3

The procedure for making Sample A in Example 2 was repeated using Radiant Daylight Fluorescent pigment R-104-6, Cerise #716, manufactured by Ciba-Geigy, in place of the Lawter Vivid Blue pigment. The results show that "Background Color" for the fresh and aged toners was rated "Clean" and "Toning Quality" was rated "Smooth" on both positive and negative-working elements described in Example 1.

I claim:

1. A dry nonelectroscopic fluorescent toner comprising fluorescent pigmented organic resin particles having a size distribution within the range of 0.2 to 50 micrometers, the improvement whereby the pigmented particles are surface coated with at least 0.1% by weight of liquid slip agent which is a silicone oil having a weight average molecular weight of about 230 to 50,000, in combination with at least 0.5% by weight of a water soluble, polymeric quaternary ammonium compound selected from the group consisting of (a)

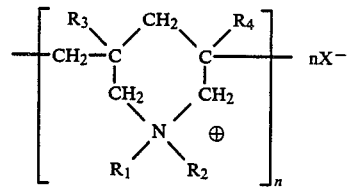

wherein $R_1$ and $R_2$ are independently selected from alkyl groups of 1 to 4 carbon atoms, $R_3$ and $R_4$ are independently selected from the group consisting of H or $CH_3$, n is a number from the group consisting of 100 to 50,000, and X is a water-solubilizing anion;

(b)

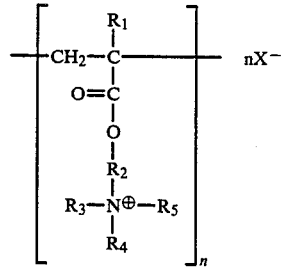

where $R_1$ is H or $CH_3$; $R_2$ is $C_xH_{2x}$ where x=2–18; $R_3$ and $R_4$ are $C_xH_{2x+1}$ where x=1–4; $R_5$ is the same as $R_3$ or $\phi$-$CH_2$; X is a water-solubilizing anion; and n is 50 to 20,000;

(c)

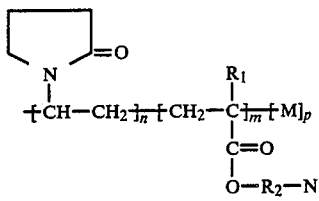

where n is 40 to 90 mole percent, m is 5 to 40 mole percent, p is 0 to 50 mole percent, and n +m +p=100; $R_1$ is H or $CH_3$; $R_2$ is $C_xH_{2x}$ where x=1 to 18; $R_3$ is $CH_3$ or $CH_2CH_3$; $R_4$ is $CH_3$, $CH_2CH_3$ or $\phi$-$CH_2$; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

(d)

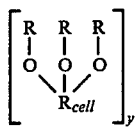

where $R_{cell}$ is a residue of an anhydroglucose unit from cellulose ($C_6H_{10}O_5$), methyl cellulose, ethyl cellulose, hydroxyethylcellulose, or hydroxypropyl methyl cellulose; y is the degree of polymerization of 50–20,000 or more; and R may be the same or different and is:

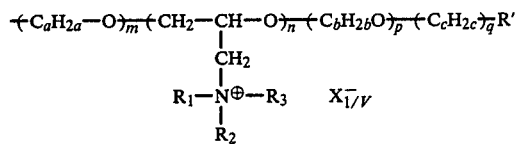

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may be equal to or different from p; R' is selected from the group consisting of H, COOH, COONa, COOK, COONH$_4$ with the proviso that when q is zero, R' is H; $R_1$, $R_2$ and $R_3$ taken individually are selected from a group consisting of alkyl, aryl, aralykyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ are taken together the nitrogen atom to which $R_1$, $R_2$ and $R_3$ are attached can be a component of a heterocyclic ring selected from a group consisting of pyridine, alpha-methyl pyridine, 2,5-dimethyl pyridine 2,4,6-trimethyl pyridine, N-methylpiperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4; and (e) copolymer of hydroxethyl cellulose and diallyldimethyl ammonium chloride.

2. A fluorescent toner according to claim 1 wherein the slip agent is polydimethylsiloxane or polymethyl (R) siloxane where R is an alkyl chain with 2 to 12 carbon atoms.

3. A fluorescent toner according to claim 1 wherein the water soluble polymeric quaternary ammonium compound is of the formula:

(a)

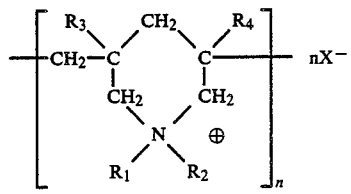

wherein $R_1$ and $R_2$ are independently selected from the group consisting of alkyl groups of 1 to 4 carbon atoms, $R_3$ and $R_4$ are independently selected from the group consisting of H or $CH_3$, n is a number from 100 to 50,000, and X is a water-solubilizing anion.

4. A fluorescent toner according to claim 1 wherein the organic resin is selected from the group consisting of triazine-modified sulfonamide resins, modified glyceryl phthalate resins, and modified vinyl resins.

5. A fluorescent toner according to claim 4 wherein the organic resin is a triazine-modified sulfonamide resin.

6. A toner according to claim 3 wherein the polymeric quaternary ammonium compound is poly(dimethyl diallyl ammonium chloride).

7. A toner according to claim 1 wherein the water soluble polymeric quaternary ammonium compound is of the formula:

(b)

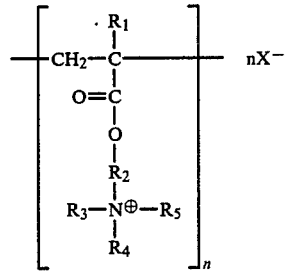

where $R_1$ is H or $CH_3$; $R_2$ is $C_xH_{2x}$ where x=2–18; $R_3$ and $R_4$ are $C_xH_{2x+1}$ where x=1–4; $R_5$ is the same as $R_3$ or $\phi$-$CH_2$; X is a water-solubilizing anion; and n is 50 to 20,000.

8. A toner according to claim 7 wherein the polymeric quaternary ammonium compound is N,N,N- trimethyl-2-[2-methyl-1-oxo-2-propenyl)oxy]-methylsulfate homopolymer.

9. A toner according to claim 1 wherein the water soluble polymeric quaternary ammonium compound is of the formula:

(c)

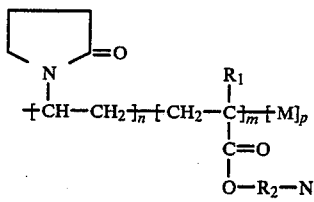

where n is 40 to 90 mole percent, m is 5 to 40 mole percent, p is 0 to 50 mole percent, and n+m+p=100; $R_1$ is H or $CH_3$; $R_2$ is $C_xH_{2x}$ where x=1 to 18; $R_3$ is $CH_3$ or $CH_2CH_3$; $R_4$ is $CH_3$, $CH_2CH_3$ or $\phi$-$CH_2$; X is a water-solubilizing anion and M is a vinyl monomer unit resulting from the heteropolymerization employing an optional monovinyl nonhydroxy-containing monomer different from and copolymerizable with the m or n units and a weight average molecular weight of 10,000 to 1,000,000.

10. A toner according to claim 9 wherein the polymeric quaternary ammonium compound is a copolymer of vinyl pyrrolidone and demethyl aminoethylmethacrylate quaternized with dimethyl suflate.

11. A toner according to claim 1 wherein the water soluble polymeric quaternary ammonium compound is of the formula:

(d)

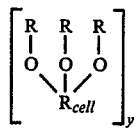

where $R_{cell}$ is a residue of an anhydroglucose unit from cellulose ($C_6H_{10}O_5$), methyl cellulose, ethyl cellulose, hydroxyethylcellulose, or hydroxypropyl methyl cellulose; y is the degree of polymerization of 50–20,000 or more; and R may be the same or different and is:

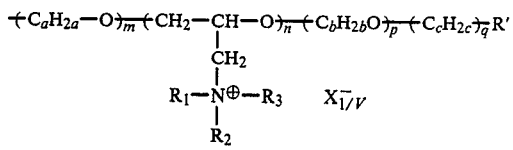

where a is an integer from 2 to 3; b is an integer from 2 to 3; c is an integer from 1 to 3; n is an integer from 1 to 3; m is an integer from 0 to 10; p is an integer from 0 to 10; and q is an integer from 0 to 1; a may be equal to or different from b; c may be equal to or different from n and m may b equal to or different from p; R' is selected from the group consisting of H, COOH, COONa, COOK, COONH4 with the proviso that when q is zero, R' is H; $R_1$, $R_2$ and $R_3$ taken individually are selected from a group consisting of alkyl, aryl, aralkyl, alkaryl, cycloalkyl, alkoxyalkyl, and alkoxyaryl radicals where each of $R_1$, $R_2$ and $R_3$ can contain up to 10 carbon atoms with the proviso that when said member is an alkoxyalkyl radical there are at least two carbon atoms separating the oxygen atom from the nitrogen atom, and with the further proviso that the total number of C atoms in radicals represented by $R_1$, $R_2$ and $R_3$ is from 3 to 12 with the further proviso that when $R_1$, $R_2$ and $R_3$ taken together the nitrogen atom to which $R_1$, $R_2$ and $R_3$ are attached can be a component of a heterocyclic ring selected from a group consisting of pyridine, alphamethyl pyridine, 2,5-dimethyl pyridine; 2,4,6-trimethyl pyridine, N-methylpiperidine, N-ethylpiperidine, N-methyl morpholine and N-ethyl morpholine; X is a water-solubilizing anion, and V is an integer equal to the valence of X; the average value of n per anhydroglucose unit of said cellulose ether is from about 0.01 to about 1, and the average value of m+p+q per anhydroglucose unit of said cellulose ether is from about 0.01 to about 4.

12. A toner according to claim 11 wherein the polymeric quaternary ammonium compound is a polymeric quaternary ammonium salt of hydroxyethyl cellulose reacted with a trimethyl ammonium substituted epoxide.

* * * * *

UNITED STATES PATENT AND TRADEMARK OFFICE
CERTIFICATE OF CORRECTION

PATENT NO. : 4,756,991
DATED : JULY 12, 1988
INVENTOR(S) : GRUBB, Eugene Leander It is certified that error appears in the above-identified patent and that said Letters Patent is hereby corrected as shown below:

Column 15, line 68, "dine 2,4,6-trimethyl..." should be --dine: 2,4,6-trimethyl...--.

Column 18, line 16, "...may b equal..." should be --may be equal--.

Signed and Sealed this

Twentieth Day of June, 1989

Attest:

DONALD J. QUIGG

Attesting Officer

Commissioner of Patents and Trademarks